(12) United States Patent
Chun

(10) Patent No.: US 10,276,665 B2
(45) Date of Patent: Apr. 30, 2019

(54) SEMICONDUCTOR DEVICE AND METHOD OF MANUFACTURING THE SAME

(71) Applicants: Hyundai Motor Company, Seoul (KR); Kia Motors Corporation, Seoul (KR)

(72) Inventor: Dae Hwan Chun, Gyeonggi-do (KR)

(73) Assignees: Hyundai Motor Company, Seoul (KR); Kia Motors Corporation, Seoul (KR)

( * ) Notice: Subject to any disclaimer, the term of this patent is extended or adjusted under 35 U.S.C. 154(b) by 0 days.

(21) Appl. No.: 15/632,842

(22) Filed: Jun. 26, 2017

(65) Prior Publication Data

US 2018/0166541 A1 Jun. 14, 2018

(30) Foreign Application Priority Data

Dec. 13, 2016 (KR) .................. 10-2016-0169891

(51) Int. Cl.
*H01L 29/16* (2006.01)
*H01L 29/78* (2006.01)
*H01L 29/66* (2006.01)
*H01L 29/423* (2006.01)

(52) U.S. Cl.
CPC ...... *H01L 29/1608* (2013.01); *H01L 29/4236* (2013.01); *H01L 29/66* (2013.01); *H01L 29/66068* (2013.01); *H01L 29/7802* (2013.01); *H01L 29/7827* (2013.01); *H01L 29/7831* (2013.01)

(58) Field of Classification Search
CPC ... H01L 29/4236; H01L 29/76; H01L 29/785; H01L 29/78648; H01L 29/1608; H01L 29/66068; H01L 29/7831; H01L 29/7827; H01L 29/7813; H01L 29/0878; H01L 29/41741; H01L 29/42368; H01L 29/1095; H01L 29/0847
See application file for complete search history.

(56) References Cited

U.S. PATENT DOCUMENTS

2005/0001264 A1* 1/2005 Ono .................. H01L 29/407
257/330
2011/0254010 A1* 10/2011 Zhang ................ H01L 29/0623
257/66

FOREIGN PATENT DOCUMENTS

JP 2005-072356 A 3/2005
KR 10-1032770 B1 5/2011

* cited by examiner

*Primary Examiner* — Sonya D. McCall-Shepard
(74) *Attorney, Agent, or Firm* — Mintz Levin Cohn Ferris Glovsky and Popeo, P.C.; Peter F. Corless

(57) ABSTRACT

A semiconductor device is provided. The semiconductor device includes a n− type layer disposed at a first surface of a n+ type silicon carbide substrate and a trench disposed at the n− type layer. Additionally, a first gate electrode and a second gate electrode are disposed in the trench and separated from each other. A source electrode is insulated from the first gate electrode and the second gate electrode. Further, the semiconductor includes a drain electrode that is disposed at a second surface of the n+ type silicon carbide substrate, a first channel disposed adjacent to a side surface of the trench and a second channel disposed under the lower surface of the trench. The first channel and the second channel are separated from each other.

14 Claims, 13 Drawing Sheets

SEMICONDUCTOR DEVICE AND METHOD OF MANUFACTURING THE SAME

CROSS-REFERENCE TO RELATED APPLICATION

Figure 1:
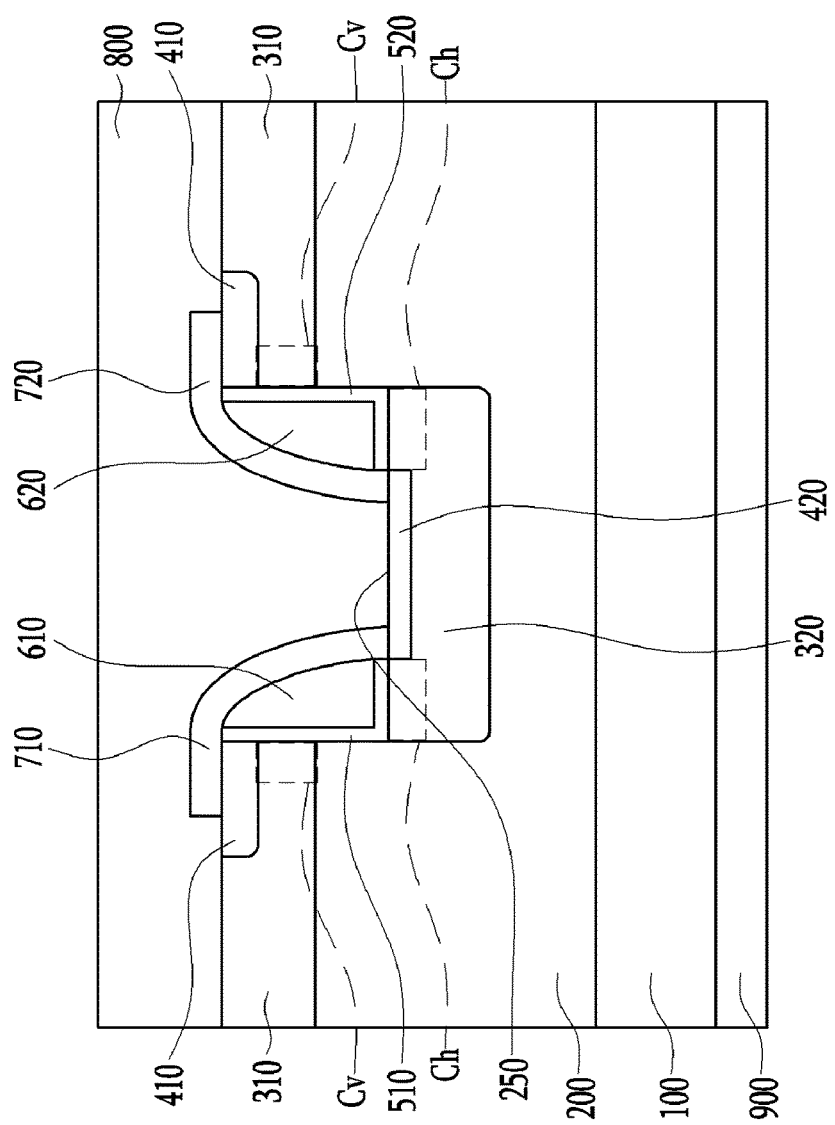

This application claims priority to and the benefit of Korean Patent Application No. 10-2016-0169891 filed in the Korean Intellectual Property Office on Dec. 13, 2016, the entire contents of which are incorporated herein by reference.

BACKGROUND

(a) Field of the Disclosure

The present disclosure relates to a semiconductor device, and more particularly, to a semiconductor device including a silicon carbide (SiC) and a manufacturing method thereof.

(b) Description of the Related Art

Generally, a power semiconductor device requires a low on-resistance or a low saturation voltage to reduce a power loss in a conduction state while allowing a substantial amount of current to flow. Additionally, a characteristic that withstands a reverse direction high voltage of a PN junction applied to both ends of the power semiconductor device at an off state or the moment that a switch is turned off (e.g., a high breakdown voltage characteristic) is required.

Among the power semiconductor device, a metal oxide semiconductor electric field effect transistor (e.g., MOSFET) digital circuit and analog circuit electric field effect transistor. The MOSFET may be divided into a planar gate MOSFET and a trench gate MOSFET based on a structure of a gate electrode of a channel. In the planar gate MOSFET, a channel region is disposed horizontal to the semiconductor surface to create a long current path and a Junction Field Effect Transistor (JFET) region is created. Accordingly, the on resistance is relatively high. In the trench gate MOSFET, the JFET region is not present and the breakdown voltage may be reduced due to the concentration of the electric field at the lower end of the trench.

The above information disclosed in this section is merely for enhancement of understanding of the background of the disclosure and therefore it may contain information that does not form the prior art that is already known in this country to a person of ordinary skill in the art.

SUMMARY

The present disclosure provides a silicon carbide semiconductor device that improves a current density. A semiconductor device according to an exemplary embodiment of the present disclosure may include a n− type layer disposed at a first surface of a n+ type silicon carbide substrate; a trench disposed at the n− type layer; a first gate electrode and a second gate electrode disposed in the trench and separated from each other; a source electrode insulated from the first gate electrode and the second gate electrode; a drain electrode disposed at a second surface of the n+ type silicon carbide substrate; a first channel disposed adjacent to a side surface of the trench; and a second channel disposed under the lower surface of the trench. The first channel and the second channel may be separated from each other.

The semiconductor device according to an exemplary embodiment may further include a first p type region disposed adjacent to the side surface of the trench and a second p type region disposed under a lower surface of the trench. The first p type region and the second p type region may be separated from each other. The first channel may be disposed at the first p type region and the second channel may be disposed at the second p type region. The semiconductor device according to an exemplary embodiment may include a first n+ type region disposed at the first p type region and a second n+ type region disposed at the second p type region. The first n+ type region and the second n+ type region may be separated from each other.

Additionally, the semiconductor device according to an exemplary embodiment may include a first gate insulating layer and a second gate insulating layer disposed in the trench and separated from each other. The first gate electrode may be disposed on the first gate insulating layer and the second gate electrode may be disposed on the second gate insulating layer. The source electrode may abut the first n+ type region and the second n+ type region. The semiconductor device according to an exemplary embodiment may include a first insulating layer that covers the first gate electrode and a second insulating layer that covers the second gate electrode. The source electrode and the drain electrode may be formed from an omic metal.

A manufacturing method of a semiconductor device according to an exemplary embodiment may include forming a n− type layer at a first surface of a n+ type silicon carbide substrate, forming a trench at the n− type layer; forming a first gate electrode and a second gate electrode separated from each other in the trench; forming a source electrode insulated from the first gate electrode and the second gate electrode; and forming a drain electrode at a second surface of the n+ type silicon carbide substrate. A first channel may be adjacent to a side surface of the trench and a second channel may be disposed under a lower surface of the trench and the first channel and the second channel may be separated from each other.

The manufacturing method of the semiconductor device according to an exemplary embodiment of the present disclosure may include forming a first p type region on the n− type layer and forming a first n+ type region on the first p type region. The trench may be formed by etching the first n+ type region, the first p type region and the n− type layer. The manufacturing method of the semiconductor device according to an exemplary embodiment may further include forming a second p type region under the lower surface of the trench and forming a second n+ type region in the second p type region. The trench may be formed by etching the n− type layer.

Additionally, the manufacturing method may include forming a first p type region adjacent to the side surface of the trench and a second p type region disposed under the lower surface of the trench. A first n+ type region disposed in the first p type region and a second n+ type region disposed in the second p type region may be formed.

As above-described, according to an exemplary embodiment, when the semiconductor device includes the first channel and the second channel separated from each other a foreword direction voltage may be applied and current density of the semiconductor device may be improved. Accordingly, an area of the semiconductor device may be reduced. Additionally, an electric field may be adjusted from being concentrated to a corner portion of the trench to increase the breakdown voltage of the semiconductor device.

BRIEF DESCRIPTION

Figure 2:
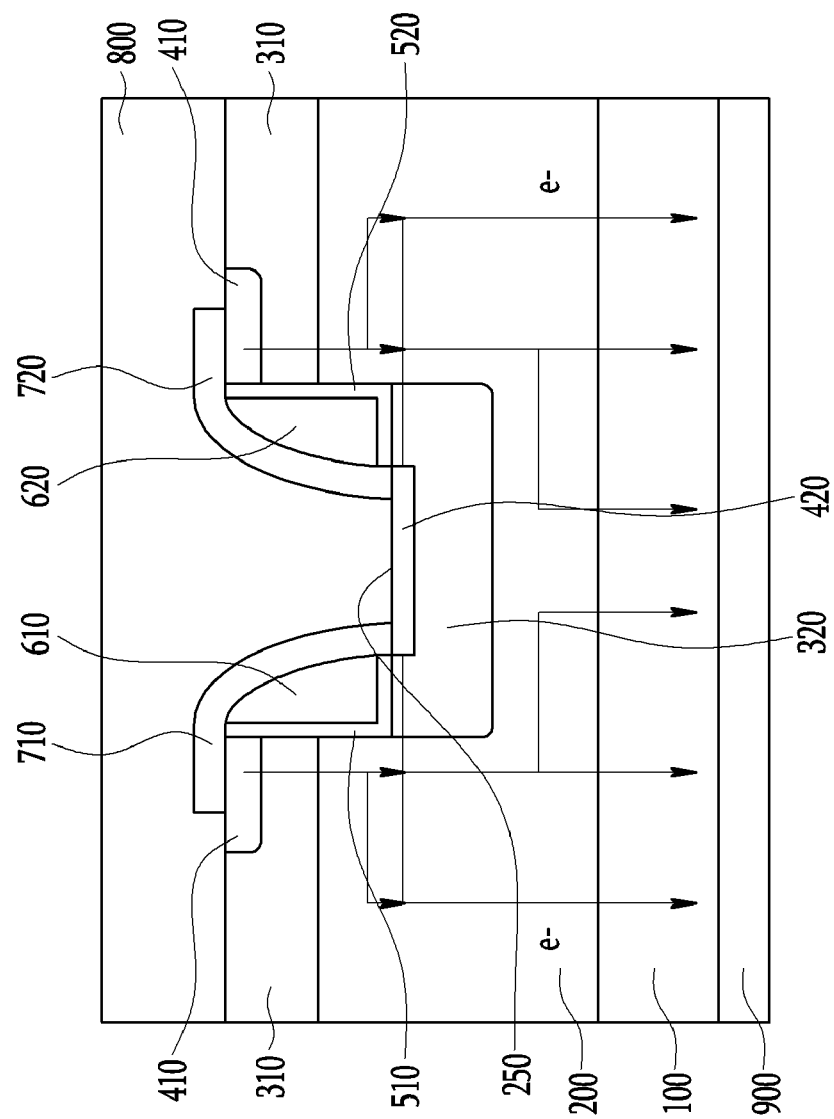

The drawings are intended to be used as references for describing the exemplary embodiments of the present dis- FIG. 1 is an exemplary cross-sectional view schematically showing an example of a semiconductor device according to an exemplary embodiment of the present disclosure;

FIG. 2 is an exemplary view schematically showing an exemplary operation of the semiconductor device according to FIG. 1 according to an exemplary embodiment of the present disclosure;

FIG. 3 to FIG. 9 are exemplary views schematically showing an exemplary embodiment of a manufacturing method of a semiconductor device according to an exemplary embodiment of the present disclosure; and FIG. 10 to FIG. 13 are exemplary views schematically showing an exemplary embodiment of a manufacturing method of a semiconductor device. according to an exemplary embodiment of the present disclosure

DETAILED DESCRIPTION

Exemplary embodiments of the present disclosure will be described in detail with reference to the accompanying drawings. However, the present disclosure is not limited to the exemplary embodiments described herein but may be embodied in other forms. Rather, the exemplary embodiments disclosed herein are provided so that this disclosure will be thorough and complete, and will fully convey the concept of the disclosure to those skilled in the art. In the drawings, the thicknesses of layers and regions are exaggerated for clarity. Also, when a layer is referred to as being "on" another layer or substrate, it may be directly formed on another layer or substrate, or a third layer may be interposed between them.

The terminology used herein is for the purpose of describing particular exemplary embodiments only and is not intended to be limiting of the disclosure. As used herein, the singular forms "a", "an" and "the" are intended to include the plural forms as well, unless the context clearly indicates otherwise. Unless otherwise described, throughout the specification, the word "comprise" and variations such as "comprises" or "comprising" will be understood to imply the inclusion of stated elements, not the exclusion of any other elements. In addition, the term "unit", "means", "part", "member", or the like, which is described in the specification, means a unit of a comprehensive configuration that performs at least one function or operation. As used herein, the term "and/or" includes any and all combinations of one or more of the associated listed items.

Unless specifically stated or obvious from context, as used herein, the term "about" is understood as within a range of normal tolerance in the art, for example within 2 standard deviations of the mean. "About" can be understood as within 10%, 9%, 8%, 7%, 6%, 5%, 4%, 3%, 2%, 1%, 0.5%, 0.1%, 0.05%, or 0.01% of the stated value. Unless otherwise clear from the context, all numerical values provided herein are modified by the term "about."

It is understood that the term "vehicle" or "vehicular" or other similar term as used herein is inclusive of motor vehicle in general such as passenger automobiles including sports utility vehicles (SUV), buses, trucks, various commercial vehicles, watercraft including a variety of boats, ships, aircraft, and the like and includes hybrid vehicles, electric vehicles, combustion, plug-in hybrid electric vehicles, hydrogen-powered vehicles and other alternative fuel vehicles (e.g. fuels derived from resources other than petroleum).

FIG. 1 is an exemplary cross-sectional view schematically showing a semiconductor device according to an exemplary embodiment of the present disclosure. Referring to FIG. 1, the semiconductor device according to the exemplary embodiment may include a n+ type silicon carbide substrate 100, a n− type layer 200, a p type region 310 and 320, a n+ type region 410 and 420, a gate electrode 610 and 620, a source electrode 800, and a drain electrode 900. The detailed structure of the semiconductor device according to the exemplary embodiment will be described.

The n− type layer 200 may be sequentially disposed at a first surface of the n+ type silicon carbide substrate 100 and a trench 250 may be disposed at the n− type layer 200. The p type region 310 and 320 may include a first p type region 310 and a second p type region 320 separated from each other. The first p type region 310 may be disposed on the n− type layer 200 and may be disposed adjacent to a side surface of the trench 250. The second p type region 320 may be disposed in the n− type layer 200 and may be disposed under the lower surface of the trench 250.

The n+ type region 410 and 420 may include a first n+ type region 410 and a second n+ type region 420 that are separated from each other. The first n+ type region 410 may be disposed in the first p type region 310 and may be disposed adjacent to the side surface of the trench 250. The second n+ type region 420 may be disposed in the second p type region 320 and may be disposed under the lower surface of the trench 250.

The gate insulating layer 510 and 520 may be disposed in the trench 250 and may include silicon oxide ($SiO_2$). Further, the gate insulating layers 510 and 520 may include a first gate insulating layer 510 and a second gate insulating layer 520 separated from each other. The first gate insulating layer 510 may be disposed in a first side surface and on a portion of the lower surface of the trench 250. In other words, the first gate insulating layer 510 may extend from the interior of the first side surface of the trench 250 onto the portion of the lower surface of the trench 250. The second gate insulating layer 520 may be disposed in a second side surface and on the portion of the lower surface of the trench 250. In other words, the second gate insulating layer 520 may extend from the interior of the second side side surface of the trench 250 onto the portion of the lower surface of the trench 250.

The gate electrode 610 and 620 may be disposed in the trench 250 and may include a first gate electrode 610 and a second gate electrode 620 that are separated from each other. The gate electrode 610 and 620 may include a poly-crystalline silicon, a metal, or the like. The first gate electrode 610 may be disposed on the first gate insulating layer 510 and the second gate electrode 620 may be disposed on the second gate insulating layer 520. The first gate electrode 610 may extend from the interior of a first side surface of the trench 250 onto the portion of the lower surface of the trench 250. The second gate electrode 620 may extend from the interior of a second side surface of the trench 250 onto the portion of the lower surface of the trench 250. The first gate electrode 610 and the second gate electrode 620 may not overlap the second n+ type region 420.

The insulating layer 710 and 720 may be positioned to cover the gate electrode 610 and 620 and may include a first insulating layer 710 and a second insulating layer 720. The insulating layer 710 and 720 may be formed from silicon oxide ($SiO_2$) or the like. The first insulating layer 710 may cover the first gate electrode 610 and the second insulating layer 720 may cover the second gate electrode 620. The first insulating layer 710 and the second insulating layer 720 may extend to the portion of the first n+ type region 410.

The source electrode 800 may be disposed on the first p type region 310, the first n+ type region 410, the second n+ type region 420, the first insulating layer 710 and the second insulating layer 720. The drain electrode 900 may be disposed at the second surface of the n+ type silicon carbide substrate 100. The source electrode 800 may abut the first n+ type region 410 and the second n+ type region 420. In particular, the source electrode 800 and the drain electrode 900 may be formed from an ohmic metal or the like. Additionally, the second surface of the n+ type silicon carbide substrate 100 may indicate an opposite surface for the first surface of the n+ type silicon carbide substrate 100.

As above-described, the semiconductor device according to the exemplary embodiment, having the p type region 310 and 320 may include a first p type region 310 and a second p type region 320 that are separated from each other. The n+ type region 410 and 420 may include a first n+ type region 410 and a second n+ type region 420 that are separated from each other. The gate electrode 610 and 620 may be disposed within the trench 250 and may include a first gate electrode 610 and a second gate electrode 620 that are separated from each other. The channel of the semiconductor device may include a first channel Cv and a second channel Ch that are separated from each other.

The first channel Cv may be disposed at the first p type region 310 that is adjacent to the side surface of the trench 250. The first channel Cv may be disposed adjacent to the side surface of the trench 250 and may also be a vertical channel. The second channel Ch may be disposed at the second p type region 320 that is disposed under the lower surface of the trench 250. The second channel Ch may be disposed at the side surface of the second n+ type region 420 and may overlap the first gate electrode 610 and the second gate electrode 620. The second channel Ch may be disposed under the lower surface of the trench 250 and may be a horizontal channel.

As described above, the channel of the semiconductor device according to the exemplary embodiment may include the first channel Cv and the second channel Ch separated from each other. In particular, when a forward direction voltage is applied, a current density of the semiconductor device may be improved. Accordingly, an area of the semiconductor device may be reduced. Additionally, when the second p type region 320 and the second n+ type region 420 are disposed under the lower surface of the trench 250, the electric field may be adjusted from being concentrated at a corner portion of the trench 250. Accordingly, the breakdown voltage of the semiconductor device may be increased.

The operation of the semiconductor device according to an exemplary embodiment will be described with reference to FIG. 2. Referring to FIG. 2, during the operation of a semiconductor device, an electron (e−) may be configured to move from the source electrode 800 to the drain electrode 900. Each channel may be disposed at the first p type region 310 and the second p type region 320 and the electron (e−) may be configured to move through these channels. In other words, the electron (e−) emitted from the source electrode 800 may be configured to move to the drain electrode 900 through the first p type region 310 adjacent to the side surface of the trench 250 and the second p type region 320 disposed under the lower surface of the trench 250.

The characteristics of the semiconductor device according to an exemplary embodiment and a general semiconductor device will be described with reference to Table 1. Table 1 shows a simulation result of the semiconductor device according to the exemplary embodiment and the general semiconductor device.

A comparative example 1 is a general planar gate MOSFET element, and a comparative example 2 is a general trench gate MOSFEET element.

TABLE 1

|  | Breakdown voltage (V) | Current density (A/cm$^2$) | Electric current portion (cm$^2$) @100 A |
|---|---|---|---|
| Comparative Example 1 | 1104 | 463.3 | 0.216 |
| Comparative Example 2 | 1078 | 543.8 | 0.184 |
| Exemplary embodiment | 1347 | 686.4 | 0.146 |

Referring to Table 1, the breakdown voltage of the semiconductor device according to the comparative example 1 is 1104 V, the breakdown voltage of the semiconductor device according to the comparative example 2 is 1078 V and the breakdown voltage of the semiconductor device according to the exemplary embodiment is 1347 V. In other words, the breakdown voltage of the semiconductor device according to the exemplary embodiment may be increased by about 22% for the semiconductor device according to the comparative example 1 and may be increased by about 25% for the semiconductor device according to the comparative example 2.

Additionally, the current density of the semiconductor device according to the comparative example 1 is 463.3 A/cm$^2$, the current density of the semiconductor device according to the comparative example 2 is 543.8 A/cm$^2$, and the current density of the semiconductor device according to the exemplary embodiment is 686.4 A/cm$^2$. In other words, the current density of the semiconductor device according to the exemplary embodiment may be increased by about 48% for the semiconductor device according to the comparative example 1 and may be increased by about 26% for the semiconductor device according to the comparative example 2.

The electric current portion of the semiconductor device according to the comparative example 1 for a current amount 100 A 0 is 216 cm$^2$. The electric current portion of the semiconductor device according to the comparative example 2 is 0.184 cm$^2$. Further, the electric current portion of the semiconductor device according to the exemplary embodiment is 0.146 cm$^2$. For example, the electric current portion for the current amount 100 A according to the exemplary embodiment may be decreased by about 32% for the semiconductor device according to the comparative example 1 and may be decreased by about 21% for the semiconductor device according to the comparative example 2. As above-described, the area of the electric current portion to form the an equivalent current for the semiconductor device according to the exemplary embodiment may be decreased compared with the semiconductor device according to the comparative examples 1 and 2 to reduce the entire area of the semiconductor device. Accordingly, a yield of the semiconductor device may be improved and a process cost may be reduced.

Figure 3:
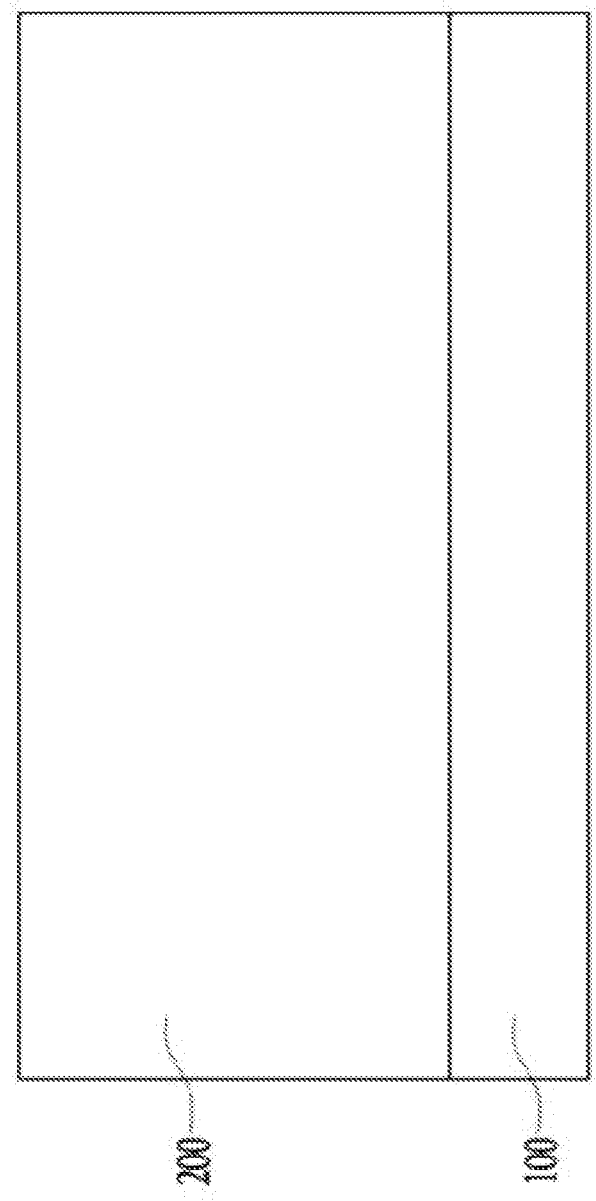

The manufacturing method of the semiconductor device according to an exemplary embodiment of the present disclosure will be described with reference to FIG. 3 to FIG. 9 and FIG. 1. FIG. 3 to FIG. 9 are exemplary views schematically showing an example of a manufacturing method of a semiconductor device of the present disclosure. Referring to FIG. 3, a n+ type silicon carbide substrate 100 may be prepared and a n− type layer 200 may be formed at a first surface of the n+ type silicon carbide substrate 100. The n− type layer 200 may be formed by an epitaxial growth on the first surface of the n+ type silicon carbide substrate 100.

Figure 4:
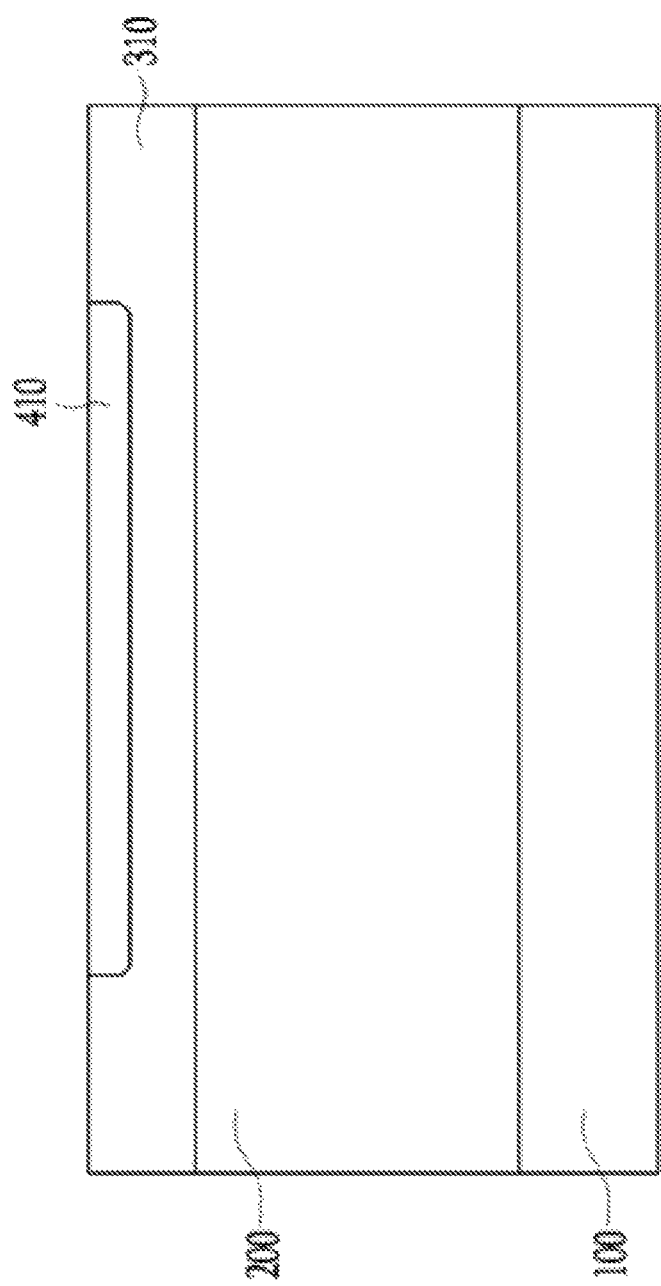

Referring to FIG. 4, a first p type region 310 may be formed on the n− type layer 200 and a first n+ type region 410 may be formed in the first p type region 310. The first p type region 310 may be formed by injecting a p type ion (e.g., boron (B), aluminum (Al), gallium (Ga), and indium (In)) to the n− type layer 200 or may be formed by the epitaxial growth on the n− type layer 200. The first n+ type region 410 may be formed by injecting a n type ion (e.g., nitrogen (N), phosphorus (P), arsenic (As), and antimony (Sb)) to the first p type region 310.

Figure 5:
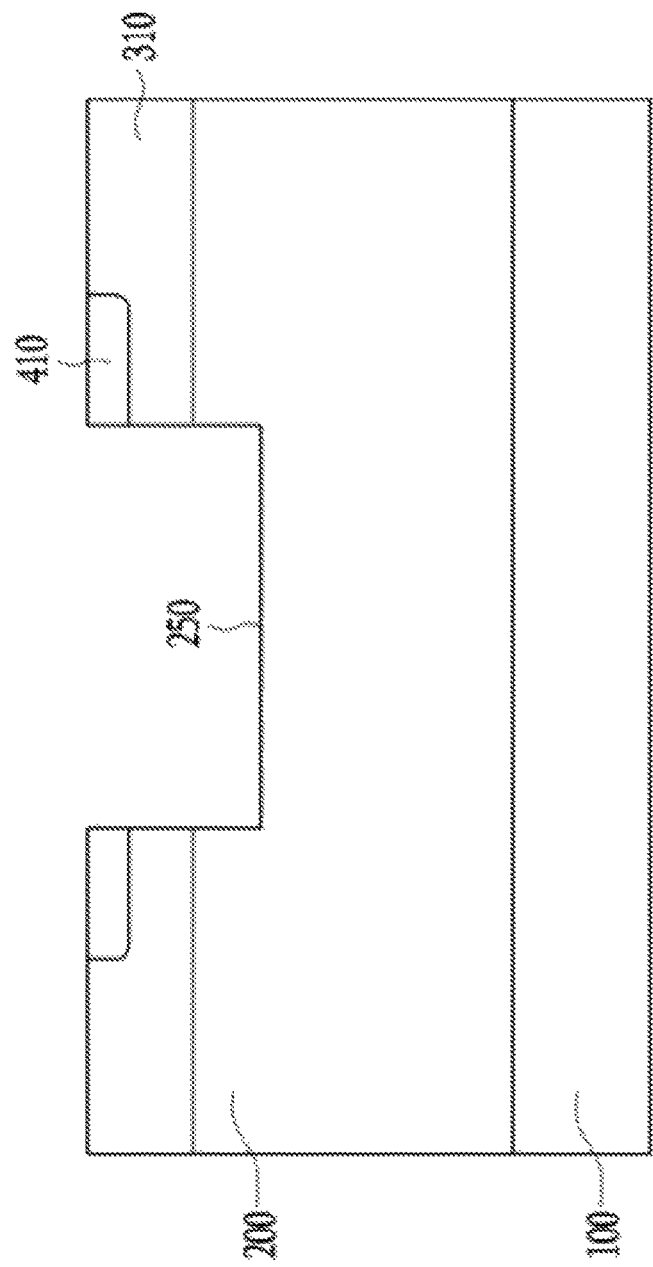
Figure 6:
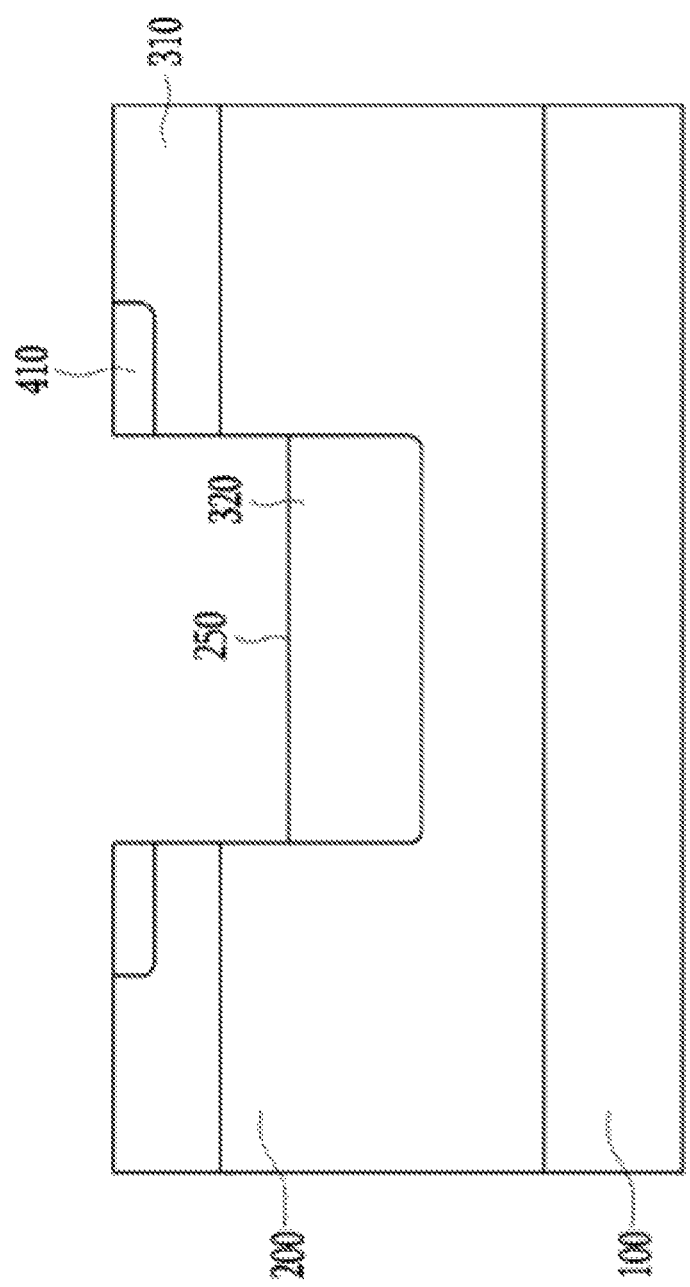

Referring to FIG. 5, the first n+ type region 410, the first p type region 310 and the n− type layer 200 may be etched to form a trench 250. In particular, the trench 250 may penetrate the first n+ type region 410 and the first p type region 310 and may be formed at the n− type layer 200. Referring to FIG. 6, a second p type region 320 may be formed at the lower surface of the trench 250. When the second p type region 320 is formed, the p type ion may be injected by using a mask used when the trench 250 is formed. Accordingly, the number of the required masks may be reduced and the second p type region 320 may be formed without an alignment error.

Figure 7:
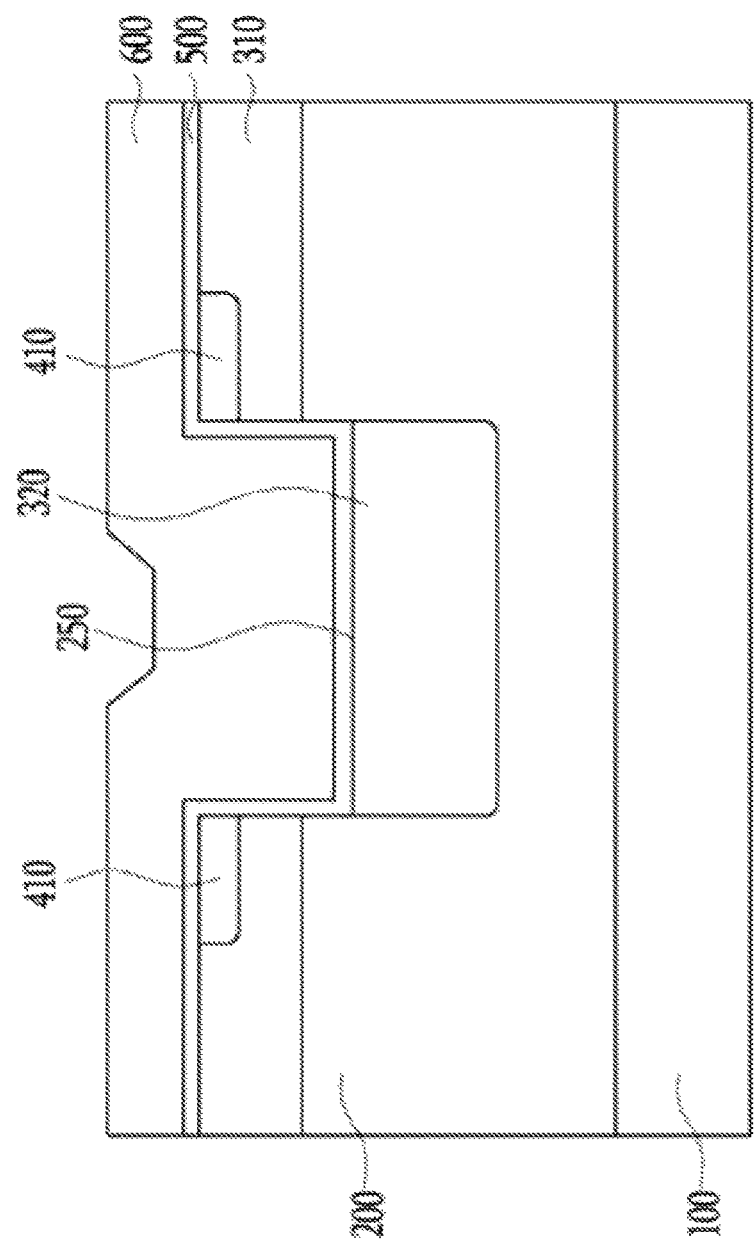

Referring to FIG. 7, a gate insulating layer 500 may be formed on the first n+ type region 410, on the first p type region 310 and in the trench 250. A gate material layer 600 may be formed on the gate insulating layer 500. The gate insulating layer 500 may be formed from silicon oxide (SiO$_2$) and the gate material layer 600 may be formed from the poly-crystalline silicon or the metal.

Figure 8:
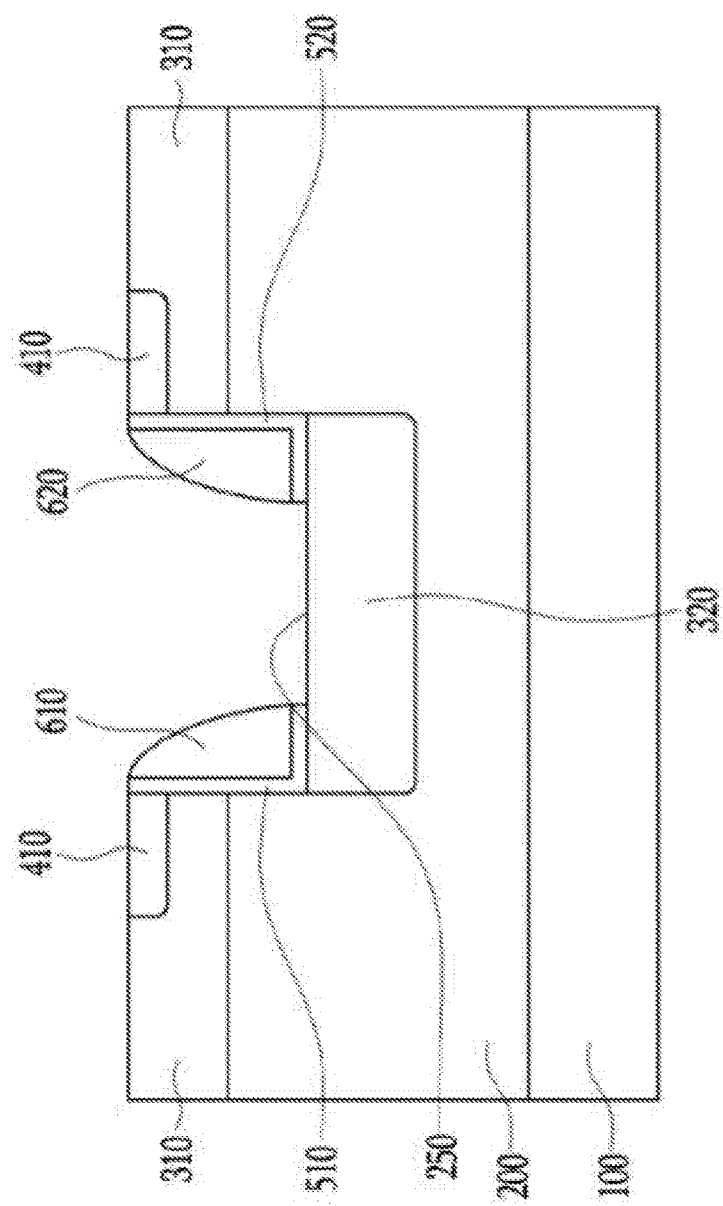

Referring to FIG. 8, the gate material layer 600 and the gate insulating layer 500 may be etched to form a gate electrode 610 and 620. A gate insulating layer 510 and 520 may be disposed at the trench 250. The gate insulating layer 510 and 520 may include a first gate insulating layer 510 and a second gate insulating layer 520 separated from each other. The first gate insulating layer 510 may extend from the interior of a first surface of the trench 250 onto the portion of the lower surface of the trench 250. The second gate insulating layer 520 may extend from the interior of the second side surface of the trench 250 onto the portion of the lower surface of the trench 250. The gate electrode 610 and 620 may include a first gate electrode 610 and a second gate electrode 620 separated from each other. The first gate electrode 610 may be disposed on the first gate insulating layer 510 and the second gate electrode 620 may be disposed on the second gate insulating layer 520.

Figure 9:
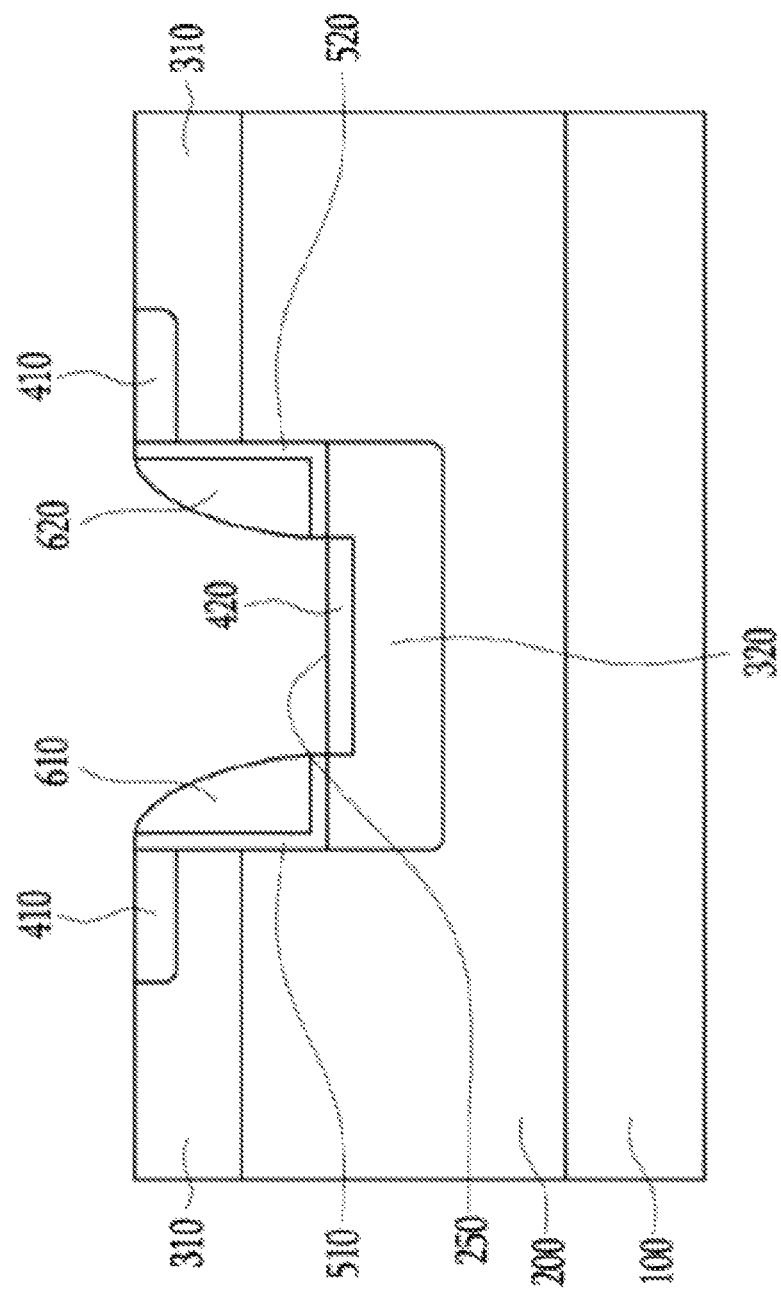

Referring to FIG. 9, a second n+ type region 420 may be formed in the second p type region 320 under the lower surface of the trench 250. When forming the second n+ type region 420, the n type ion may be injected using the first gate electrode 610 and the second gate electrode 620 as a mask. Accordingly, the second n+ type region 420 may be formed without the alignment error.

Referring to FIG. 1, a first insulating layer 710 and a second insulating layer 720 that cover the first gate insulating layer 510 and the second gate insulating layer 520 may be formed. A source electrode 800 may be formed on the first p type region 310, the first n+ type region 410, the second n+ type region 420, the first insulating layer 710, and the second insulating layer 720. Additionally, a drain electrode 900 may be formed at a second surface of the n+ type silicon carbide substrate 100.

Figure 10:
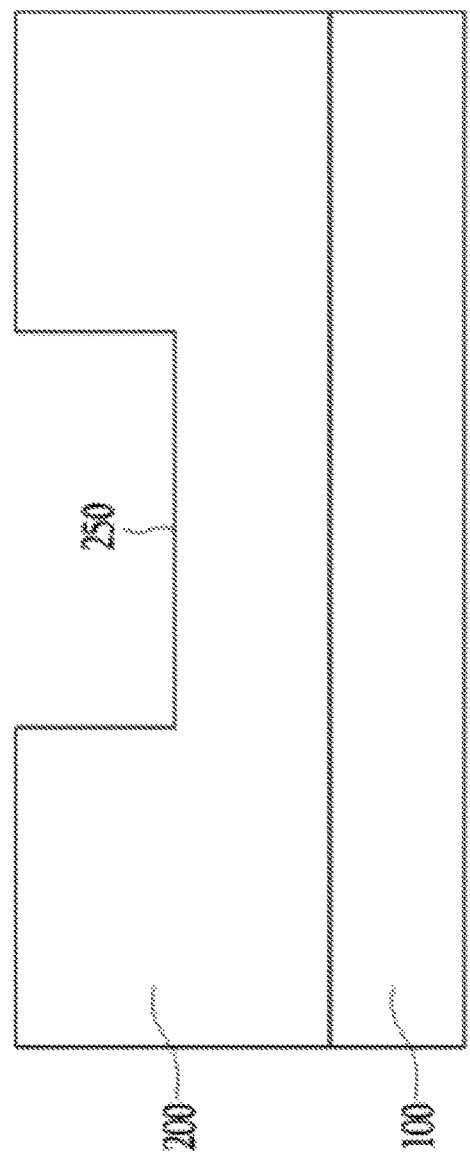

Alternatively, in an exemplary embodiment, the trench 250 may be formed after forming the first p type region 310 and the first n+ type region 410 or the trench 250 may be formed first. Next, forming the trench be described with reference to FIG. 10 to FIG. 13 and FIG. 1. FIG. 10 to FIG. 13 are exemplary views that schematically illustrate an example of a manufacturing method of a semiconductor device of the present disclosure. Referring to FIG. 10, a n+ type silicon carbide substrate 100 may be prepared, a n− type layer 200 may be formed at a first surface of the n+ type silicon carbide substrate 100 and then the n− type layer 200 may be etched to form a trench 250. The n− type layer 200 may be formed on the first surface of the n+ type silicon carbide substrate 100 through the epitaxial growth.

Figure 11:
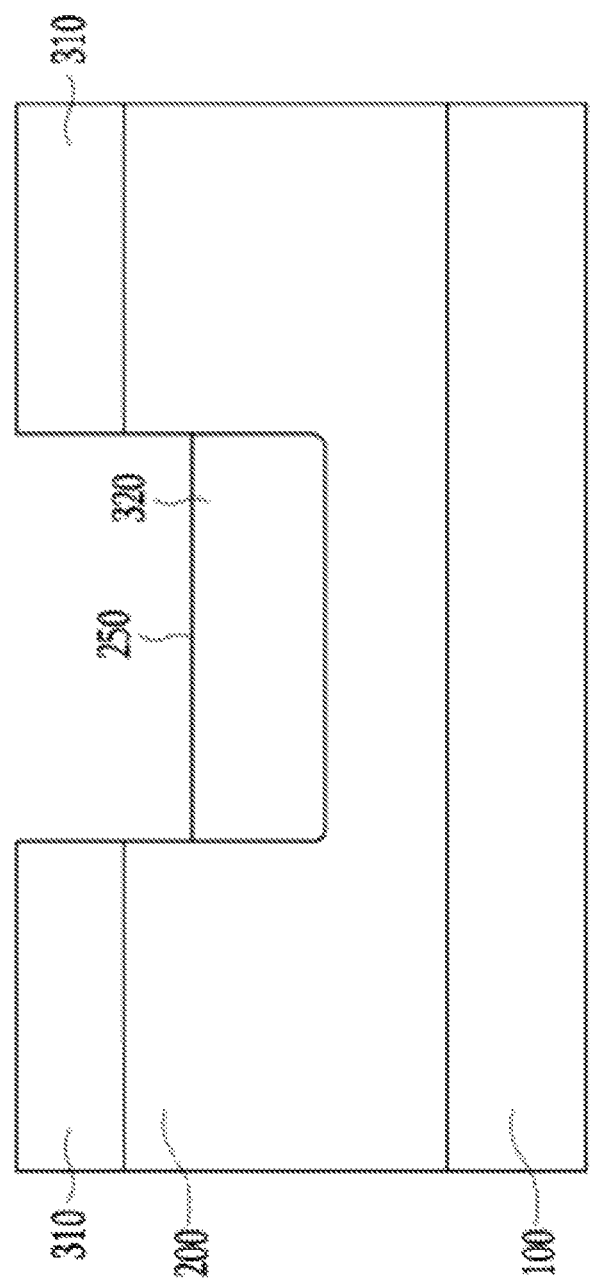

Referring to FIG. 11, a first p type region 310 may be formed on the n− type layer 200 and a second p type region 320 may be formed under the lower surface of the trench 250. The first p type region 310 and the second p type region 320 may be formed by injecting the p type ion to the n− type layer 200. In other words, the first p type region 310 and the second p type region 320 may be formed simultaneously.

Figure 12:
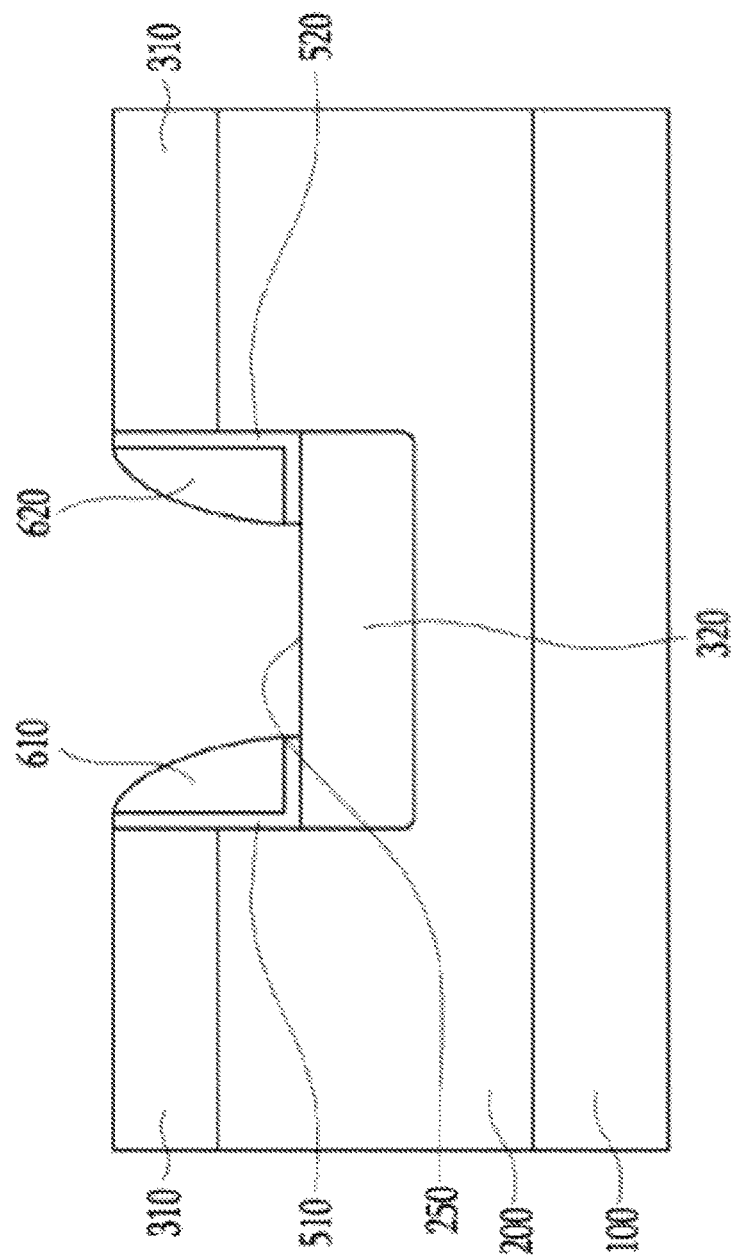

Referring to FIG. 12, a gate electrode 610 and 620 and a gate insulating layer 510 and 520 may be formed in the trench 250. The gate electrode 610 and 620 and the gate insulating layer 510 and 520 may include a gate insulating layer and a gate material layer, as shown in FIG. 7. Further, the gate insulating layer and the gate material layer may be etched.

The gate insulating layer 510 and 520 may include a first gate insulating layer 510 and a second gate insulating layer 520 separated from each other. The first gate insulating layer 510 may extend from the interior of a first side surface of the trench 250 onto the portion of the lower surface of the trench 250. The second gate insulating layer 520 may extend from the interior of the second side surface of the trench 250 onto the portion of the lower surface of the trench 250.

The gate electrode 610 and 620 may include a first gate electrode 610 and a second gate electrode 620 separated from each other. The first gate electrode 610 may be disposed on the first gate insulating layer 510 and the second gate electrode 620 may be disposed on the second gate insulating layer 520.

Figure 13:
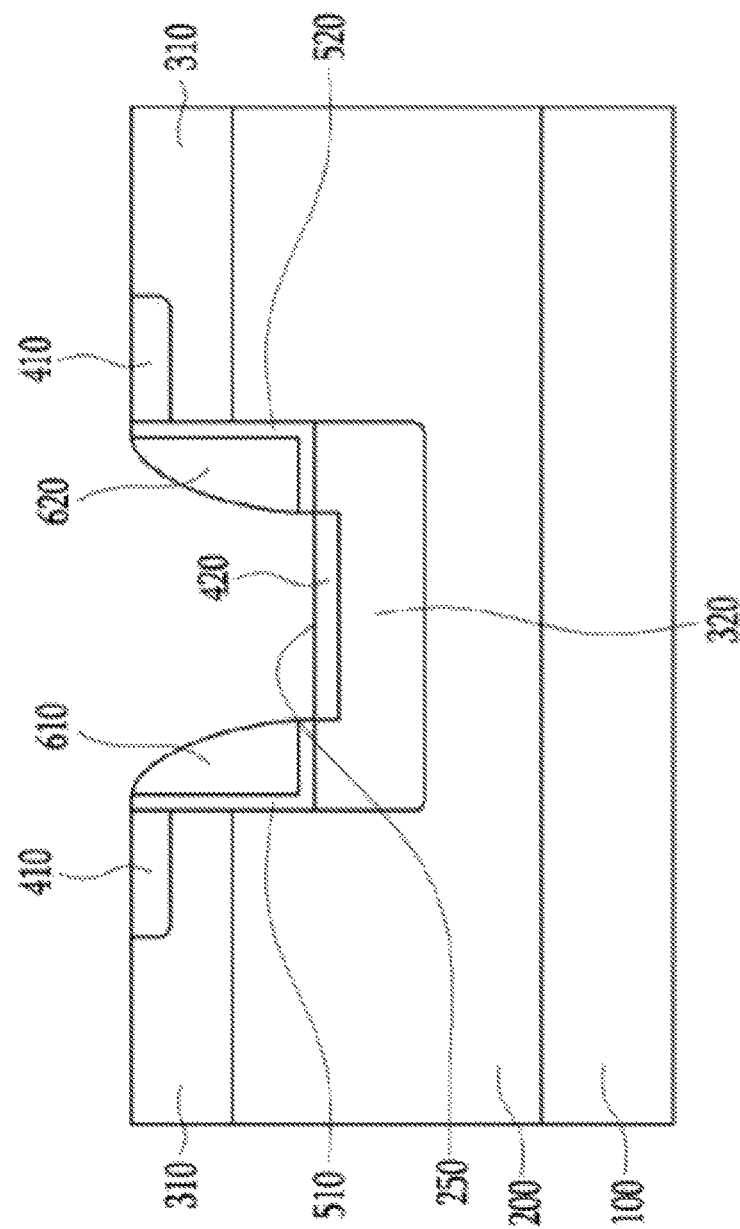

Referring to FIG. 13, a first n+ type region 410 may be formed in the first p type region 310 and a second n+ type region 420 may be formed in the second p type region 320. The first n+ type region 410 and the second n+ type region 420 may be formed by injecting the n type ion to the first p type region 310 and the second p type region 320, respectively. In other words, the first n+ type region 410 and the second n+ type region 420 may be formed simultaneously.

Referring back to FIG. 1, a first insulating layer 710 and a second insulating layer 720 that cover the first gate insulating layer 510 and the second gate insulating layer 520, respectively may be formed. A source electrode 800 may be formed on the first p type region 310, the first n+ type region 410, the second n+ type region 420, the first insulating layer 710 and the second insulating layer 720. Additionally, a drain electrode 900 may be formed at a second surface of the n+ type silicon carbide substrate 100.

While this disclosure has been described in connection with what is presently considered to be exemplary embodiments, it is to be understood that the disclosure is not limited to the disclosed exemplary embodiments, but, on the contrary, is intended to cover various modifications and equivalent arrangements comprised within the spirit and scope of the appended claims.

DESCRIPTION OF SYMBOLS

100: n+ type silicon carbide substrate
200: n− type layer
250: trench
310: first p type region
320: second p type region
410: first n+ type region
420: second n+ type region
510: first gate insulating layer
520: second gate insulating layer
610: first gate electrode
620: second gate electrode
800: source electrode
900: drain electrode
Cv: first channel
Ch: second channel

What is claimed is:

1. A semiconductor device, comprising:
a n− type layer disposed at a first surface of a n+ type silicon carbide substrate;
a trench disposed at the n− type layer;
a first gate electrode and a second gate electrode disposed in the trench and separated from each other;
a source electrode insulated from the first gate electrode and the second gate electrode;
a drain electrode disposed at a second surface of the n+ type silicon carbide substrate;
a first channel disposed adjacent to a side surface of the trench;
a second channel disposed under the lower surface of the trench;
a first p type region disposed adjacent to the side surface of the trench;
a second p type region disposed under a lower surface of the trench;
a first n+ type region disposed at the first p type region; and
a second n+ type region disposed at the second p type region, wherein
the first channel and the second channel are separated from each other,
the first p type region and the second p type region are separated from each other,
the first channel is disposed at the first p type region,
the second channel is disposed at the second p type region, and
the first n+ type region and the second n+ type region are separated from each other.

2. The semiconductor device of claim 1, further comprising:
a first gate insulating layer and a second gate insulating layer disposed in the trench and separated from each other,
wherein the first gate electrode is disposed on the first gate insulating layer, and
wherein the second gate electrode is disposed on the second gate insulating layer.

3. The semiconductor device of claim 2, wherein the source electrode abuts the first n+ type region and the second n+ type region.

4. The semiconductor device of claim 3, further comprising:

a first insulating layer covering the first gate electrode; and
a second insulating layer covering the second gate electrode.

5. The semiconductor device of claim 1, wherein the source electrode and the drain electrode are formed of an ohmic metal.

6. A method for manufacturing a semiconductor device, comprising:
forming a n− type layer at a first surface of a n+ type silicon carbide substrate;
forming a first p type region on the n− type layer;
forming a first n+ type region on the first p type region;
forming a trench at the n− type layer;
forming a second p type region under the lower surface of the trench;
forming a first gate electrode and a second gate electrode separated from each other in the trench;
forming a second n+ type region in the second p type region;
forming a source electrode insulated from the first gate electrode and the second gate electrode; and
forming a drain electrode at a second surface of the n+ type silicon carbide substrate, wherein
a first channel is disposed adjacent to a side surface of the trench and a second channel is disposed under a lower surface of the trench,
the first channel and the second channel are separated from each other, and
the trench is formed by etching the first n+ type region, the first p type region, and the n− type layer.

7. The method of claim 6, wherein the first p type region and the second p type region are separated from each other, and wherein the first n+ type region and the second n+ type region are separated from each other.

8. The method of claim 7, wherein the first channel is disposed at the first p type region, and the second channel is disposed at the second p type region.

9. The method of claim 8, wherein the source electrode abuts the first n+ type region and the second n+ type region.

10. A method for manufacturing a semiconductor device, comprising:
forming a n− type layer at a first surface of a n+ type silicon carbide substrate;
forming a trench at the n− type layer, wherein the trench is formed by etching the n− type layer;
forming a first p type region disposed adjacent to the side surface of the trench and a second p type region disposed under the lower surface of the trench;
forming a first gate electrode and a second gate electrode separated from each other in the trench;
forming a first n+ type region disposed in the first p type region and a second n+ type region disposed in the second p type region;
forming a source electrode insulated from the first gate electrode and the second gate electrode; and
forming a drain electrode at a second surface of the n+ type silicon carbide substrate, wherein
a first channel is disposed adjacent to a side surface of the trench,
a second channel is disposed under a lower surface of the trench, and
the first channel and the second channel are separated from each other.

11. The method of claim 10, wherein the first p type region and the second p type region are separated from each other, and the first n+ type region and the second n+ type region are separated from each other.

12. The method of claim 11, wherein the first channel is disposed at the first p type region, and the second channel is disposed at the second p type region.

13. The method of claim 12, wherein the source electrode abuts the first n+ type region and the second n+ type region.

14. The method of claim 6, further comprising:
   forming a first insulating layer and a second insulating layer, wherein
   the first insulating layer covers the first gate electrode and is disposed between the first gate electrode and the source electrode, and
   the second insulating layer covers the second gate electrode and is disposed between the second gate electrode and the source electrode.

* * * * *